United States Patent
Chen et al.

(10) Patent No.: US 8,928,361 B1
(45) Date of Patent: Jan. 6, 2015

(54) COMMON WELL BIAS DESIGN FOR A DRIVING CIRCUIT AND METHOD OF USING

(71) Applicant: Taiwan Semiconductor Manufacturing Company, Ltd., Hsinchu (TW)

(72) Inventors: Chia-Hui Chen, Hsinchu (TW); Yu-Ren Chen, Zhudong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/045,500

(22) Filed: Oct. 3, 2013

(51) Int. Cl.
*H03B 1/00* (2006.01)
*H03K 3/00* (2006.01)
*H03K 17/687* (2006.01)

(52) U.S. Cl.
CPC .................................. *H03K 17/687* (2013.01)
USPC ........... 327/108; 327/109; 327/110; 327/111; 327/112

(58) Field of Classification Search
CPC ........... H03K 19/00361; H04L 25/028; H04L 25/0272
See application file for complete search history.

(56) References Cited

U.S. PATENT DOCUMENTS

| | | | | |
|---|---|---|---|---|
| 5,500,610 A | * | 3/1996 | Burstein | 326/85 |
| 5,696,459 A | * | 12/1997 | Neugebauer et al. | 327/108 |
| 5,786,713 A | * | 7/1998 | Koyama et al. | 327/108 |
| 6,194,948 B1 | * | 2/2001 | Scian et al. | 327/382 |
| 6,681,033 B1 | * | 1/2004 | Yano et al. | 382/124 |
| 2003/0133329 A1 | * | 7/2003 | Satoh | 365/185.22 |
| 2009/0091358 A1 | * | 4/2009 | Chauhan et al. | 327/108 |
| 2012/0262202 A1 | * | 10/2012 | Lee et al. | 326/63 |
| 2014/0132309 A1 | * | 5/2014 | Chaung et al. | 327/108 |

* cited by examiner

*Primary Examiner* — Adam Houston
(74) *Attorney, Agent, or Firm* — Lowe Hauptman & Ham, LLP

(57) ABSTRACT

A driving circuit includes a common well. The driving circuit further includes a first output buffer having a bulk connected to the common well, the first output buffer having a first terminal configured to receive a first signal, and having a second terminal connected to the common well. The driving circuit further includes a second output buffer having a bulk connected to the common well, the second output buffer having a first terminal configured to receive the first signal, wherein a second terminal of the second output buffer disconnected from the common well. The driving circuit further includes a first driver connected to the second terminal of the first output buffer and a second driver connected to the second terminal of the second output buffer.

20 Claims, 9 Drawing Sheets

COMMON WELL BIAS DESIGN FOR A DRIVING CIRCUIT AND METHOD OF USING

BACKGROUND

A driving circuit is used to help regulate a current applied to circuits. Integrated circuits include driving circuits between two circuits which have different operating voltages to help ensure proper functionality and reduce a risk of damage between the two circuits. Buffers are used to help regulate a voltage applied to drivers.

By controlling a driving strength of a driver, the driving current of the driving circuit is also regulated. In some driving circuits, a plurality of buffers is connected to a plurality of drivers to provide more precise control over the driving current.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the disclosed subject matter. Specific examples of components and arrangements are described below to simplify the present disclosure. These are examples and are not intended to be limiting.

Figure 1A:
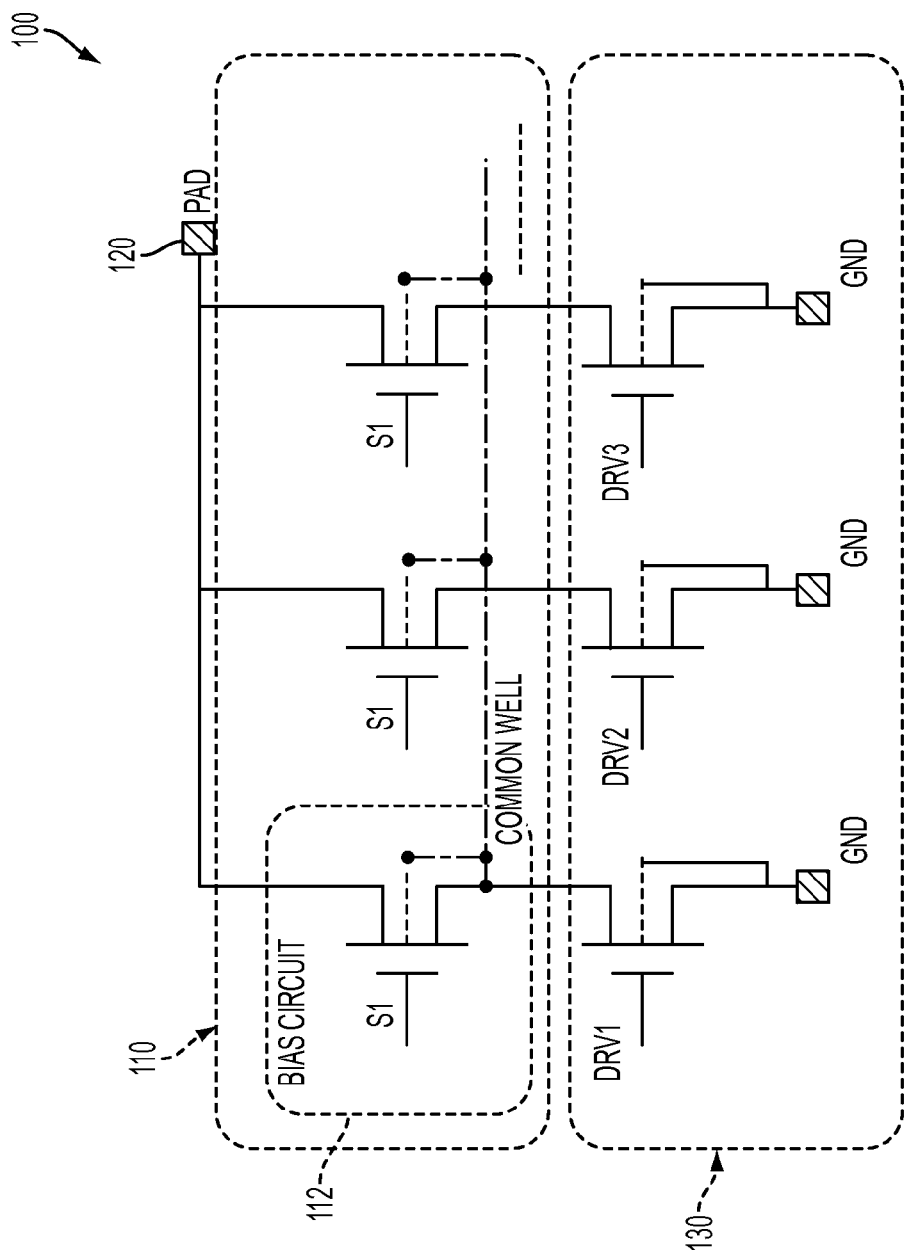
FIG. 1A is a schematic diagram of a common well bias design for a driving circuit in accordance with one or more embodiments.

FIG. 1A is a schematic diagram of a common well bias design for a driving circuit 100 in accordance with one or more embodiments. Driving circuit 100 is implemented using n-type metal-oxide-semiconductor (NMOS) transistors. Driving circuit 100 includes output buffers 110 connected in parallel. A gate of each output buffer 110 is configured to receive a control signal 51. A first terminal of each output buffer is connected to input/output (I/O) pad 120. Output buffers 110 are formed in a common well. A bulk of each output buffer 110 is connected to the common well. One output buffer of the output buffers 110 is a bias circuit 112. Bias circuit 112 has a second terminal connected to the common well. The remaining output buffers 110 do not include a connection between a second terminal of each output buffer 110 and the common well. Driving circuit 100 further includes drivers 130 configured to provide a driving current to I/O pad 120 through corresponding output buffers 110. A gate of each driver 130 is configured to receive a separate control signal DRV1, DRV2, DRV3. A first terminal of each driver 130 is connected to the second terminal of the corresponding output buffer 110. A second terminal of each driver 130 is connected to a ground voltage GND. A bulk of each driver 130 is also connected to ground voltage GND. In some embodiments, the first terminal is a drain and the second terminal is a source. In some embodiments, a number of stages is greater or less than three, and the control signal is extended to N stage drivers in parallel using N driving signals, e.g., DRV1, DRV2, DRV3 . . . DRVn.

Output buffers 110 are used to help control a voltage level between I/O pad 120 and drivers 130. In embodiments of FIG. 1, each output buffer 110 is an n-type metal-oxide-semiconductor (NMOS) transistor. In some embodiments, a different type of switching element, such as a bi-polar transistor (BJT), a high electron mobility transistor (HEMT), a thyristor, or other suitable switching element, is used in place of the NMOS transistor. A source of each output buffer 110 is connected to a corresponding driver 130. A drain of each output buffer 110 is connected to I/O pad 120. In embodiments of FIG. 1, output buffers 110 include three output buffers. In some embodiments, a number of output buffers 110 is greater or less than three.

Bias circuit 112 is configured to provide a bias voltage to the common well shared by all output buffers 110. The second terminal of bias circuit 112 is connected to the common well. A voltage from I/O pad 120 passes from the first terminal of bias circuit 112 to the second terminal and into the common well when bias circuit 112 is in a conducting state. In some embodiments, a voltage applied to the common well is higher than an operating voltage of driving circuit 100. In embodiments of FIG. 1, output buffer 110 corresponding to a first driver, i.e., receiving driving signal DRV1, is bias circuit 112. In some embodiments, a different output buffer 110 is used as bias circuit 112.

I/O pad 120 is configured to connect driving circuit 100 to external circuitry. In some embodiments, I/O pad 120 is bonded to the external circuitry. In some embodiments, I/O pad 120 is used as a testing location to determine a functional state of driving circuit 100.

Drivers 130 are configured to provide a driving current to additional circuitry. In some embodiments, the additional circuitry is provided on a side of drivers 130 opposite output buffers 110. In some embodiments, the additional circuitry is the external circuitry connected to I/O pad 120. Each driver 130 is configured to receive separate driving signals, DRV1, DRV2, DRV3 . . . DRVn, etc. Driving signals DRV1, DRV1, DRV3 . . . DRVn control an amount of current flowing through each driver 130 during operation. By selectively activating drivers 130, a current provided to the additional circuitry is able to be regulated.

In embodiments of FIG. 1, each driver 130 is an NMOS transistor. In some embodiments, a different type of switching element, such as a BJT, an HEMT, thyristor, or other suitable switching element, is used in place of the NMOS transistor.

Figure 1B:
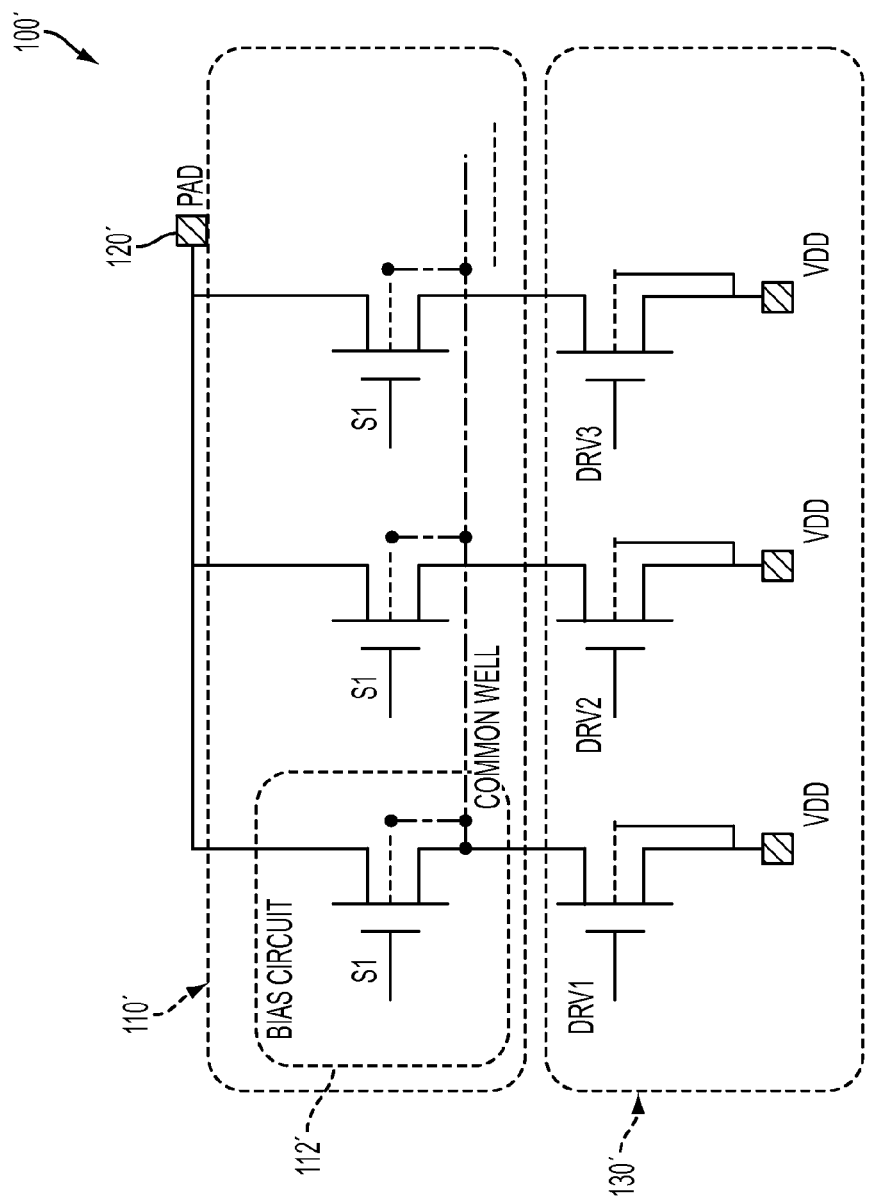
FIG. 1B is a schematic diagram of a common well bias design for a driving circuit in accordance with one or more embodiments.

FIG. 1B is a schematic diagram of a common well bias design for a driving circuit 100' in accordance with one or more embodiments. In comparison with driving circuit 100, driving circuit 100' is implemented using p-type metal-oxide-semiconductor (PMOS) transistors; similar elements are designated by a same reference number including a prime. Each driver 130' is a PMOS transistor, and each second terminal of driver 130' is connected to an operating voltage VDD. In some embodiments, the first terminal is a drain and the second terminal is a source.

Figure 2A:
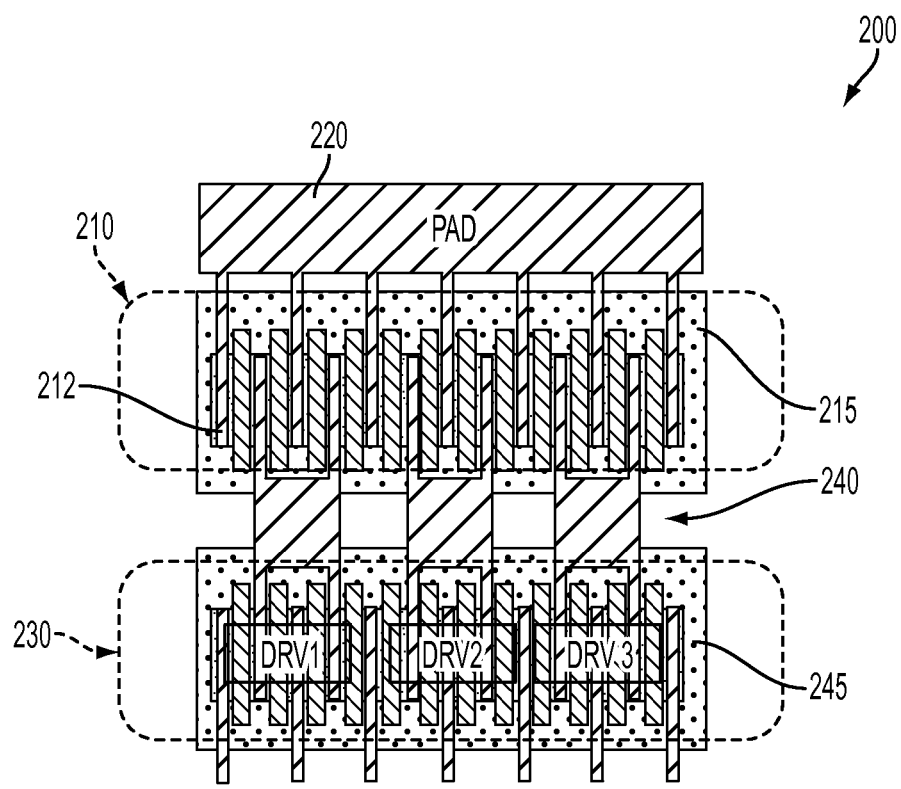
FIGS. 2A and 2B are top views of a layout of a common well bias design for a driving circuit in accordance with one or more embodiments.

FIG. 2A is a top view of a layout of a common well bias design for a driving circuit 200 in accordance with one or more embodiments. Driving circuit 200 is similar to driving circuit 100 (FIG. 1). Similar elements have a same reference number increased by 100. Driving circuit 200 includes output buffers 210 in a common well 215. Electrical connectors 240 provide electrical connection between a corresponding output buffer 210 and driver 230. Electrical connectors 240 are distinct for each corresponding pair of output buffer 210 and driver 230. Drivers 230 are in a grounded well 245. Grounded well 245 is spaced from common well 215.

Common well 215 provides a bias voltage to a bulk of each output buffer 210 through bias circuit 212. By placing output buffers 210 in common well 215, an overall size of driving circuit 200 is reduced with respect to approaches which include output buffers 210 in distinct separate wells. In embodiments of FIG. 2A, common well 215 includes a p-type dopant. In some embodiments, common well 215 includes an n-type dopant. A type of dopant used in common well 215 is determined by a type of transistor used to form output buffers 210.

Electrical connectors 240 are configured to provide electrical connection between corresponding output buffers 210 and drivers 230. Each output buffer 210/driver 230 pair includes a separate electrical connector. Electrical connectors 240 are separated from one another by a distance sufficient to avoid signal transfer between various electrical connectors. Electrical connectors comprise electrically conductive material. In some embodiments, electrical connectors 240 include copper, aluminum, tungsten, alloys thereof, or other suitable conductive metal materials. In some embodiments, electrical connectors 240 include a conductive polymer.

Grounded well 245 is connected to ground voltage GND. Grounded well 245 provides a ground bias voltage to a bulk of each driver 230. In embodiments of FIG. 2A, grounded well 245 includes a p-type dopant. In some embodiments, grounded well 245 includes an n-type dopant. In embodiments, where grounded well 245 contains n-type dopants, the grounded well is connected to operating voltage VDD. A type of dopant used and the voltage applied in grounded well 245 are determined by a type of transistor used to form drivers 230.

Figure 2B:
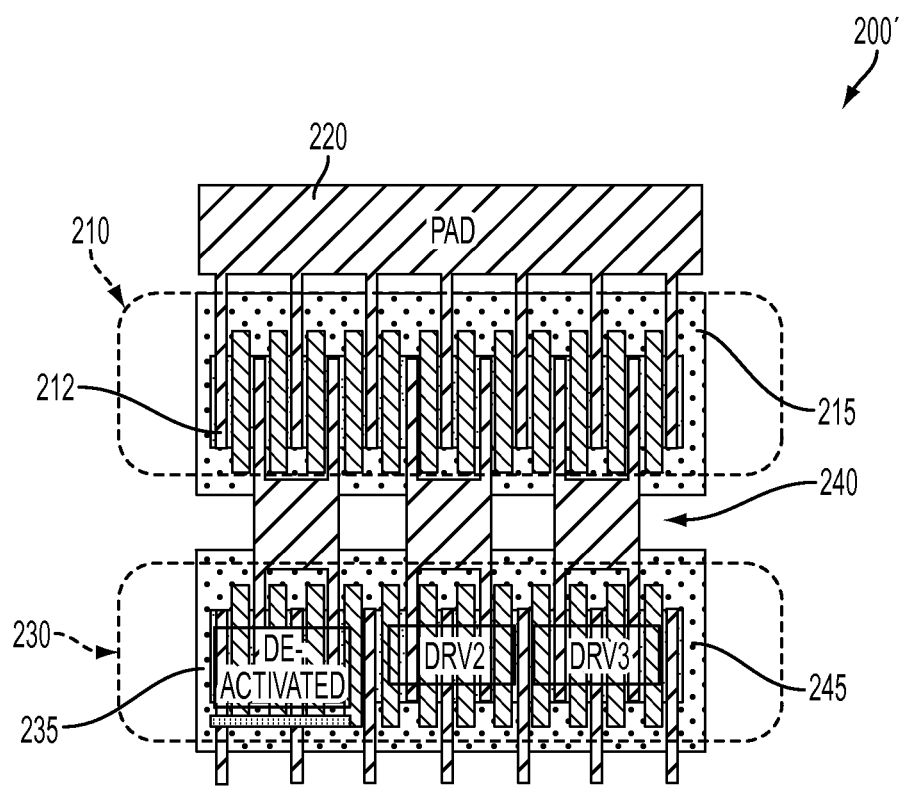

FIG. 2B is a top view of a layout of a common well bias design for a driving circuit 200' in accordance with one or more embodiments. Driving circuit 200' is similar to driving circuit 200. In contrast with driving circuit 200, driving circuit 200' includes a driver 235 connected to bias circuit 212 having a gate connected to ground voltage GND. Driver 235 is an NMOS transistor, so connecting the gate of driver 235 to ground voltage GND causes the driver to be in a non-conductive state. In some embodiments, where driver 235 is a PMOS transistor, the gate of driver 235 is connected to operating voltage VDD. By having driver 235 in the non-conductive state, bias circuit 212 is protected from high currents which could potentially damage the bias circuit and other components in driving circuit 200'. In addition, having driver 235 in the non-conductive state forces current through bias circuit 212 to be discharged through common well 215 which helps to provide a stronger bias for the bulks of output buffers 210.

When a corresponding driver, e.g., driver 130 (FIG. 1A), is connected to an output buffer, e.g., output buffer 110 is activated, the output buffer operates similar to a resistor. In other approaches where the second terminal of every output buffer is connected to the common well, a resulting serial resistance from the output buffers produces a non-linear relationship between a driving strength of the driving circuit and a driving current through the driving circuit. In other approaches where each output buffer is formed in a separate well from wells for other output buffers, the non-linear aspect of the relationship is reduced; however, spaces between the separate wells increases an overall size of the driving circuit. In contrast, driving circuits, e.g., driving circuit 100 (FIG. 1A), driving circuit 100' (FIG. 1B); driving circuit 200 (FIG. 2A, or driving circuit 200' (FIG. 2B), include a bias circuit having a second terminal connected to a common well shared by all output buffers. By using a single bias circuit having a terminal connected to the common well, a linear relationship between the driving strength and the driving current is obtained. The linear relationship helps to accurately control the driving current based on controlling driving signals, e.g., DRV1, DRV2 and DRV3, applied to the gates of drivers, e.g., drivers 130.

Figure 3:
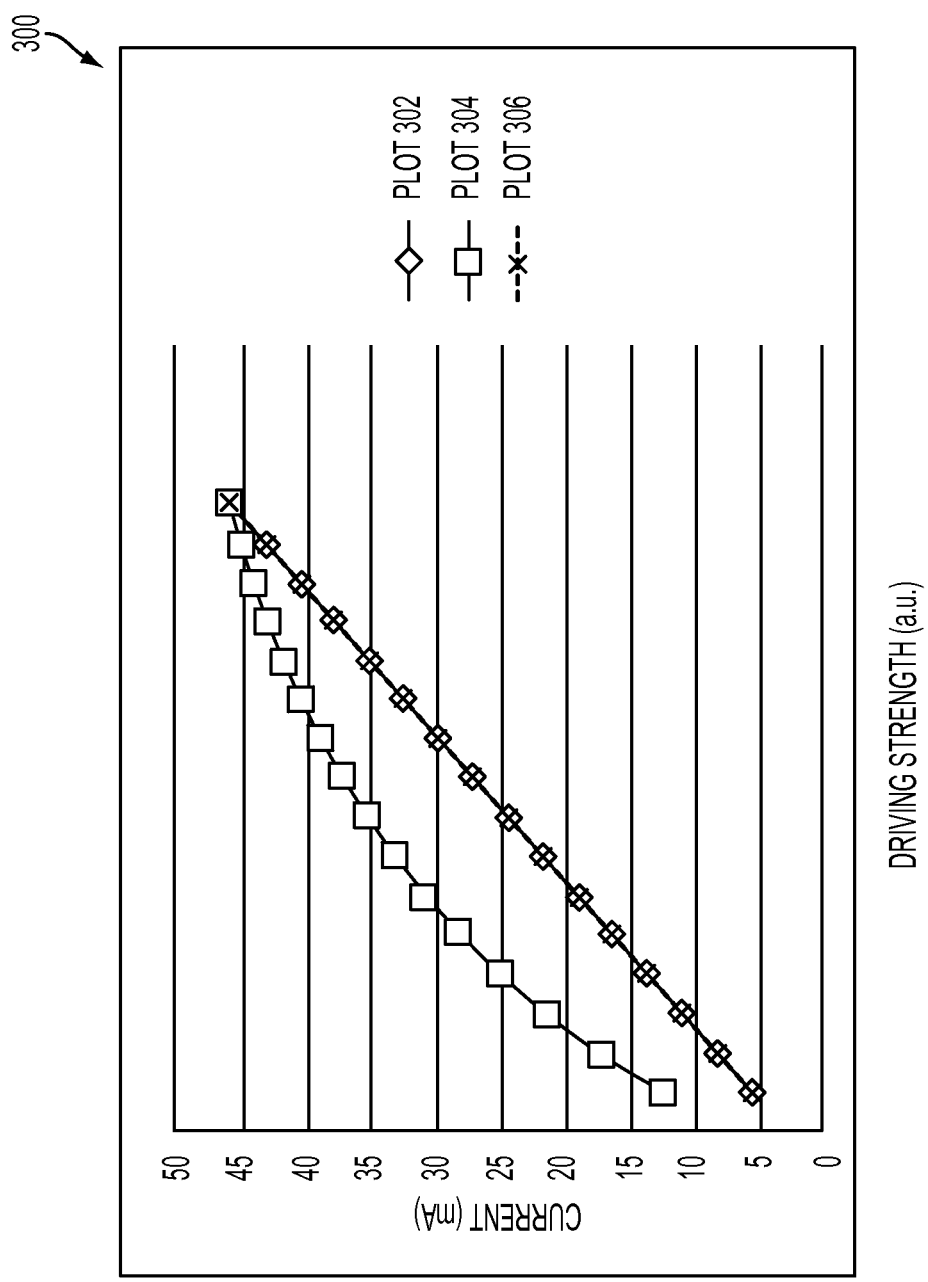
FIG. 3 is a graph of driver strength vs. current for different driving circuits in accordance with one or more embodiments.

FIG. 3 is a graph 300 of driver strength vs. current for different driving circuits in accordance with one or more embodiments. Graph 300 includes a plot 302 corresponding to a driving circuit including a bias circuit, e.g., bias circuit 112 (FIG. 1). Graph 300 further includes a plot 304 corresponding to a driving circuit where all output buffers have a terminal connected to a common well. Graph 300 further includes a plot 306 corresponding to a driving circuit where each output buffer is in a separate well from the other output buffers.

Plot 302 indicates a more linear relationship between the driver strength and the driving current in comparison with plot 304. As a result, a control system for regulating a driving current through the driving circuit is easier to predict and implement. Plot 306 also indicates a linear relationship; however, due to the separation distance between the separate wells associated with the device of plot 306, the device has an increased layout area in comparison with the device associated with plot 302. An overall size of the driving circuit associated with plot 302 is also smaller than the driving circuit associated with plot 306 due to omitting spaces between the separate wells.

Figure 4:
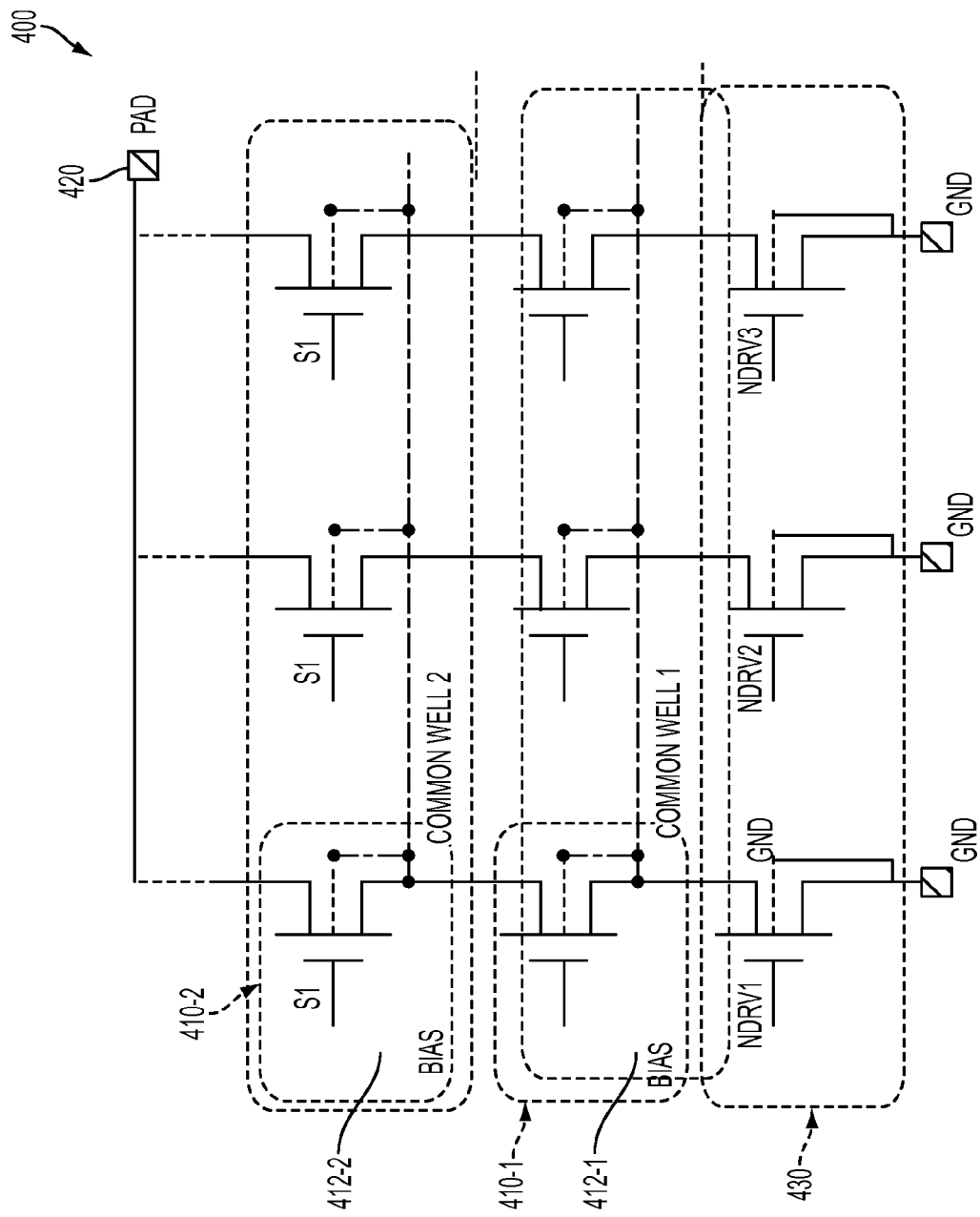
FIG. 4 is a schematic diagram of a common well bias design for a stacked driving circuit in accordance with one or more embodiments.

FIG. 4 is a schematic diagram of a common well bias design for a stacked driving circuit 400 in accordance with one or more embodiments. Stacked driving circuit 400 is similar to driving circuit 100. Similar elements have a same reference number increased by 300. In contrast with driving circuit 100, stacked driving circuit 400 includes N rows of output buffers. A number of rows N of output buffers is greater than or equal to two. In embodiments of FIG. 4, two rows of output buffers are included in stacked driving circuit 400. A first row of output buffers 410-1 includes a first bias circuit 412-1 which is similar to bias circuit 112 (FIG. 1). A second row of output buffers 410-2 includes a second bias circuit 412-2 which is similar to bias circuit 112. Second row of output buffers 410-2 is connected between first row of output buffers 410-1 and I/O pad 420. A first terminal of bias circuit 412-1 is connected to a second terminal of bias circuit 412-2. In embodiments of FIG. 4, bias circuit 412-1 and bias circuit 412-2 are connected to a first driver 430 configured to receive driver signal DRV1. In some embodiments, bias circuit 412-1 and bias circuit 412-2 are connected to a driver other than the first driver 430.

Stacked driving circuit 400 is capable of receiving a higher voltage from I/O pad 420 than driving circuit 100 is able to receive from I/O pad 120 with a low risk of damage to the stacked driving circuit. The voltage from I/O pad 420 is shared between the first row of output buffers 410-1 and the second row of output buffers 410-2, which reduces the impact of the voltage on the components of stacked driving circuit 400. In some embodiments, the transistors used to implement stacked driving circuit 400 are PMOS and a bulk and second terminal of drivers 430 are connected to operating voltage VDD.

Figure 5A:
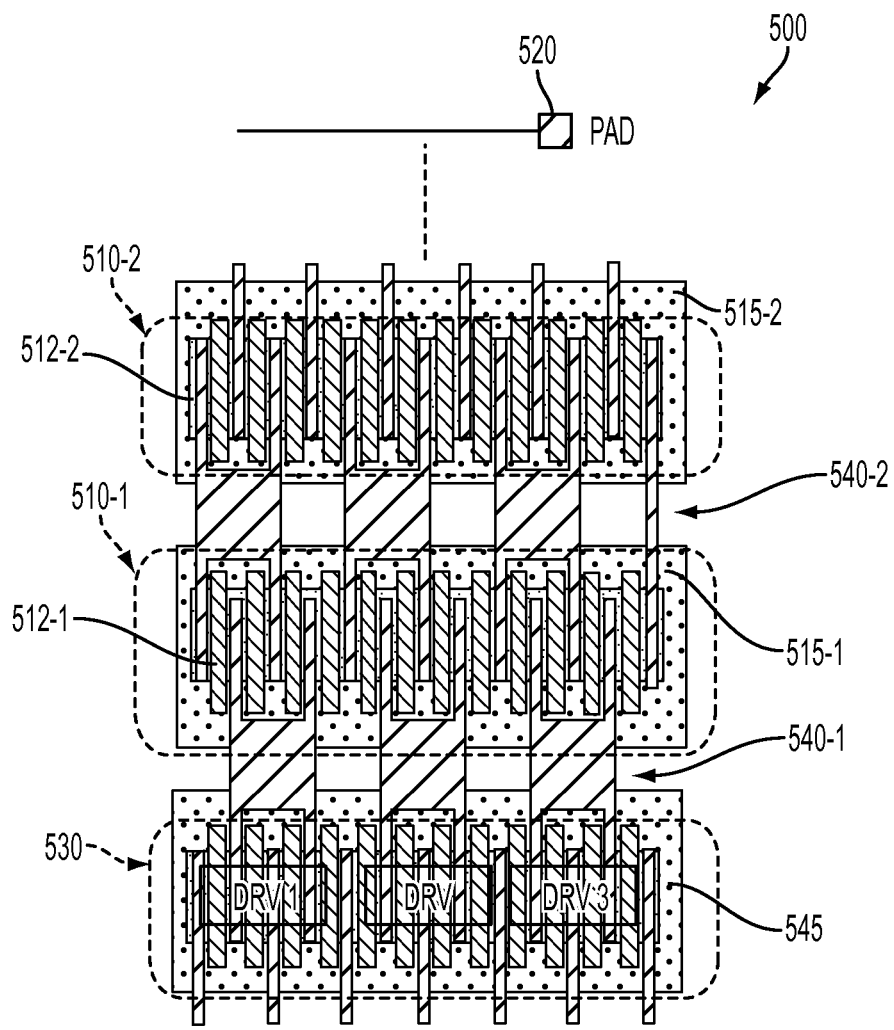
FIGS. 5A and 5B are top views of a layout of a common well bias design for a stacked driving circuit in accordance with one or more embodiments.

FIG. 5A is a top view of a layout of a common well bias design for a stacked driving circuit 500 in accordance with one or more embodiments. Stacked driving circuit 500 is similar to stacked driving circuit 400. Similar elements have a same reference number increased by 100. Stacked driving circuit 500 includes first row of output buffers 510-1 in a first common well 515-1. Stacked driving circuit 500 includes second row of output buffers 510-2 in a second common well 515-2 spaced from the first common well. First common well 515-1 and second common well 515-2 are connected to one another because the second terminal of bias circuit 512-2 is connected to both second common well 515-2 and bias circuit 512-1. Stacked driving circuit 500 also includes a first row of electrical connectors 540-1 for providing electrical connection between a corresponding output buffer in the first row of output buffers 510-1 and drivers 530. Stacked driving circuit 500 also includes a second row of electrical connectors 540-2 for providing electrical connection between a corresponding output buffer in the second row of output buffers 510-2 and an output buffer in the first row of output buffers 510-1. Electrical connectors in the first row of electrical connectors 240-1 are separate from one another. Similarly, electrical connectors 240-2 in the second row of electrical connectors 240-2 are separate from one another.

Figure 5B:
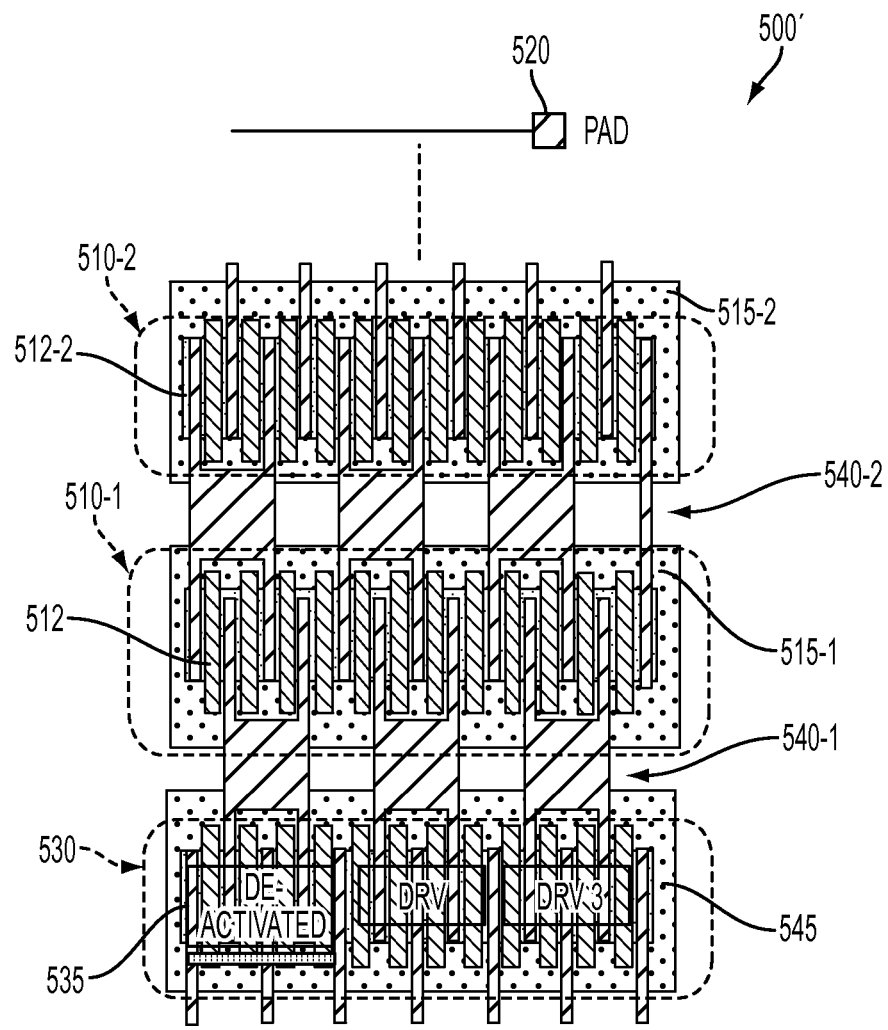

FIG. 5B is a top view of a layout of a common well bias design for a stacked driving circuit 500' in accordance with one or more embodiments. Stacked driving circuit 500' is similar to driving circuit 500. In contrast with driving circuit 500, driving circuit 500' includes a driver 535 connected to bias circuit 512-1 and bias circuit 512-2 having a gate connected to ground voltage GND. Driver 535 is an NMOS transistor, so driver 535 is in a non-conductive state. In some embodiments, where driver 535 is a PMOS transistor, the gate of driver 535 is connected to an operating voltage. By having driver 535 in the non-conductive state, bias circuit 512-1 and bias circuit 512-2 are protected from high currents which could potentially damage the bias circuits and other components in driving circuit 500'. In addition having driver 535 in the non-conductive state, forces current through bias circuit 512-1 and bias circuit 512-2 to be discharged through first common well 515-1 and second common well 515-2 which helps to provide a stronger bias for the bulks of output buffers 510-1 and output buffers 510-2.

Figure 6:
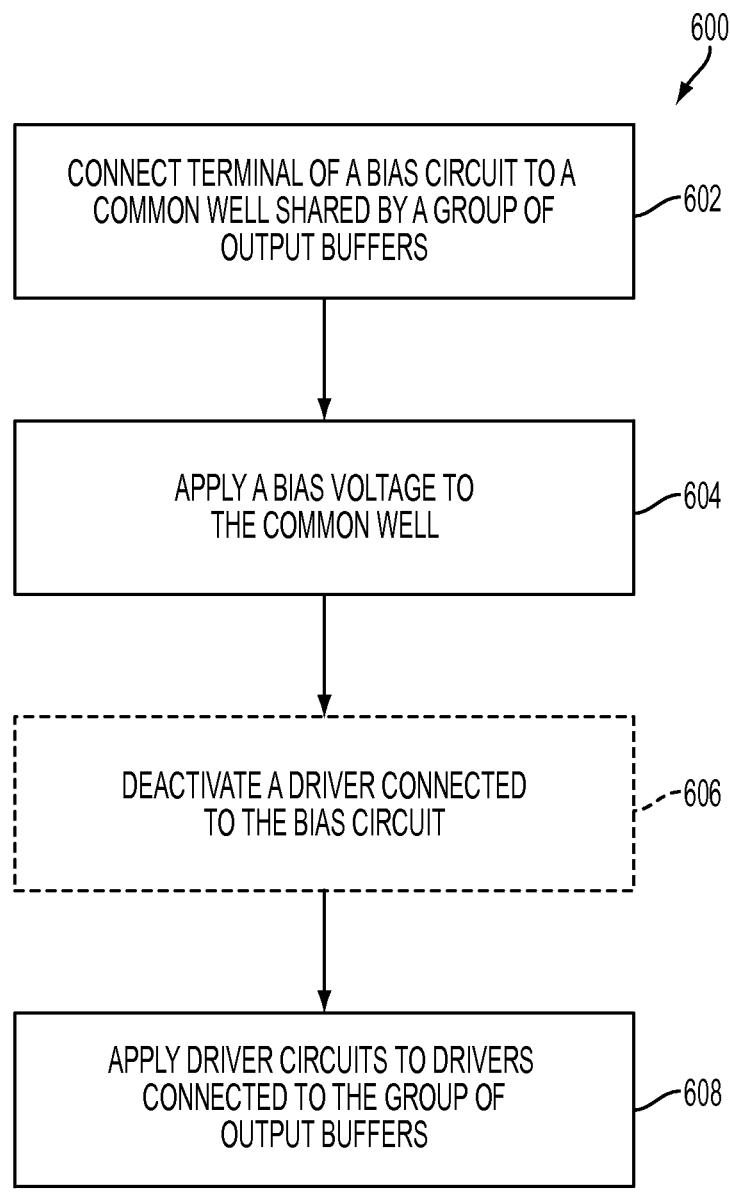
FIG. 6 is a flow chart of a method of using a common well bias design for a driving circuit in accordance with one or more embodiments.

FIG. 6 is a flow chart of a method 600 of using a common well bias design for a driving circuit in accordance with one or more embodiments. Method 600 begins with operation 602 in which a terminal of a bias circuit is electrically connected to a common well shared by a group of output buffers. In some embodiments, the bias circuit includes a NMOS transistor and the source is connected to the common well. In some embodiments, the bias circuit is a PMOS and the source is connected to the common well and operating voltage VDD.

Method 600 continues with operation 604 in which a bias voltage is applied to a bulk of each output buffer in the group of output buffers. The bias voltage is applied to the bulk of each output buffer based on the connection between the bias circuit and the common well. In some embodiments, the bias voltage is greater than an operating voltage.

In optional operation 606, a driver connected to the bias circuit is deactivated. The driver connected to the bias circuit is deactivated by connecting a gate of the driver to a constant voltage. In some embodiments, the driver is an NMOS transistor and the constant voltage is a ground voltage. In some embodiments, the driver is a PMOS transistor and the constant voltage is an operating voltage. In some embodiments, operation 606 is omitted if the voltage applied to the group of output buffers and the drivers is sufficiently low to reduce the risk of damage to the driving circuit.

In operation 608, driving signals are applied to drivers. Each driver is connected to a corresponding output buffer. Each driver is configured to receive an independent driving signal. The driving signal regulates a driving current through the driving circuit. The driving strength of the driving current has a substantially linear relationship with a driving current of the driving circuit.

One of ordinary skill in the art would recognize an order of the operations of method 600 is changeable. One of ordinary skill will also recognize that additional operations are able to be added to method 600.

One aspect of this description relates to a driving circuit. The driving circuit includes a common well. The driving circuit further includes a first output buffer having a bulk connected to the common well, the first output buffer having a first terminal configured to receive a first signal, and having a second terminal connected to the common well. The driving circuit further includes a second output buffer having a bulk connected to the common well, the second output buffer having a first terminal configured to receive the first signal, wherein a second terminal of the second output buffer disconnected from the common well. The driving circuit further includes a first driver connected to the second terminal of the first output buffer and a second driver connected to the second terminal of the second output buffer.

Another aspect of this description relates to a stacked driving circuit. The stacked driving circuit includes a first common well and a second common well separated from the first common well. The stacked driving circuit includes a first row of output buffers, each output buffer of the first row of output buffers having a bulk connected to the first common well. The first row of output buffers includes a first output buffer having a first terminal configured to receive a first signal, and having a second terminal connected to the first common well, wherein each other output buffer of the first row of output buffers has a first terminal configured to receive the first signal and a second terminal disconnected from the first common well. The stacked driving circuit further includes a second row of output buffers, each output buffer of the second row of output buffers having a bulk connected to the second common well. The second row of output buffers includes a second buffer having a first terminal connected to the second terminal of the first output buffer, wherein a second terminal of the second output buffer is connected to the second common well, wherein each other output buffer of the second row has a first terminal configured to receive a signal from the first row of output buffers, and a second terminal disconnected from the second common well. The stack driving circuit further includes a row of drivers. The row of drivers includes a first driver connected to the second terminal of the second output buffer.

Still another aspect of this description relates to a method of using a driving circuit. The method includes applying a bias voltage to the common well through the first output buffer. The first output buffer has a terminal connected to the common well. The first output buffer is part of a group of output buffers, wherein terminals of each output buffer of the group of output buffers other than the first output buffer are disconnected from the common well, and the common well is connected to a bulk of each output buffer of the group of output buffers. The method further includes applying an independent drive signal to each driver of a group of drivers, wherein each driver of the group of drivers is connected to a corresponding output buffer of the group of output buffers.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A driving circuit comprising:
  a common well;
  a first output buffer having a bulk connected to the common well, the first output buffer having a first terminal configured to receive a first signal, and having a second terminal connected to the common well;
  a second output buffer having a bulk connected to the common well, the second output buffer having a first terminal configured to receive the first signal, wherein a second terminal of the second output buffer is disconnected from the common well;
  a first driver connected to the second terminal of the first output buffer; and
  a second driver connected to the second terminal of the second output buffer.

2. The driving circuit of claim 1, wherein the first driver is an n-type metal-oxide-semiconductor (NMOS) transistor and a gate of the first driver is connected to a ground voltage.

3. The driving circuit of claim 1, wherein a gate of the first driver is configured to receive a first driving signal and a gate of the second driver is configured to receive a second driving signal.

4. The driving circuit of claim 1, wherein the common well is configured to apply a bias voltage to the bulk of the first output buffer and to the bulk of the second output buffer, and the bias voltage is greater than an operating voltage of the driving circuit.

5. The driving circuit of claim 1, further comprising:
  a first electrical connector connecting the first output buffer to the first driver; and
  a second electrical connector connecting the second output buffer to the second driver.

6. The driving circuit of claim 5, wherein the first electrical connector is separated from the second electrical connector.

7. The driving circuit of claim 1, wherein a bulk of the first driver is connected to a ground voltage, and a bulk of the second driver is connected to the ground voltage.

8. The driving circuit of claim 1, wherein the first driver is a p-type metal-oxide-semiconductor (PMOS) transistor and a gate of the first driver is connected to an operating voltage of the driving circuit.

9. The driving circuit of claim 1, wherein the common well contains p-type dopants.

10. The driving circuit of claim 1, further comprising:
  a third output buffer having a bulk connected to the common well, the third output buffer having a first terminal configured to receive the first signal, wherein a second terminal of the third output buffer disconnected from the common well; and
  a third driver connected to the second terminal of the third output buffer.

11. A stacked driving circuit comprising:
  a first common well;
  a second common well separated from the first common well;
  a first row of output buffers, each output buffer of the first row of output buffers having a bulk connected to the first common well, the first row of output buffers comprising:
    a first output buffer having a first terminal configured to receive a first signal, and having a second terminal connected to the first common well, wherein each other output buffer of the first row of output buffers has a first terminal configured to receive the first signal and a second terminal disconnected from the first common well;
  a second row of output buffers, each output buffer of the second row of output buffers having a bulk connected to the second common well, the second row of output buffers comprising:
    a second buffer having a first terminal connected to the second terminal of the first output buffer, wherein a second terminal of the second output buffer is connected to the second common well, wherein each other output buffer of the second row has a first terminal configured to receive a signal from the first row of output buffers, and a second terminal disconnected from the second common well; and
  a row of drivers, the row of drivers comprising:
    a first driver connected to the second terminal of the second output buffer.

12. The stacked driving circuit of claim 11, wherein the first driver is an n-type metal-oxide-semiconductor (NMOS) transistor and a gate of the first driver is connected to a ground voltage.

13. The stacked driving circuit of claim 11, wherein the first driver is a p-type metal-oxide-semiconductor (PMOS) transistor and a gate of the first driver is connected to an operating voltage of the driving circuit.

14. The stacked driving circuit of claim 11, wherein a gate of the first driver is configured to receive a first driving signal and a gate of each other driver of the row of drivers is configured to receive an independent driving signal.

15. The stacked driving circuit of claim 11, further comprising:
  a first row of electrical connectors configured to connect each output buffer of the first row of output buffers to a corresponding output buffer of the second row of output buffers; and
  a second row of electrical connectors configured to connect each output buffer of the second row of output buffers to a corresponding driver of the row of drivers.

16. The stacked driving circuit of claim 15, wherein each electrical connector of the first row of electrical connectors is separated from each other electrical connector of the first row of electrical connectors, and each electrical connector of the second row of electrical connectors is separated from each other electrical connector of the second row of electrical connectors.

17. The stacked driving circuit of claim 11, wherein a bulk of each driver of the row of drivers is connected to a ground voltage.

18. A method of using a driving circuit, the method comprising:
  applying a bias voltage to a common well through a first output buffer, the first output buffer having a terminal connected to the common well, wherein the first output buffer is part of a group of output buffers, terminals of each output buffer of the group of output buffers other than the first output buffer are disconnected from the common well, and the common well is connected to a bulk of each output buffer of the group of output buffers; and applying an independent drive signal to each driver of a group of drivers, wherein each driver of the group of drivers is connected to a corresponding output buffer of the group of output buffers.

19. The method of claim 18, further comprising de-activating a driver connected to the first output buffer.

20. The method of claim 18, wherein applying the bias voltage to the common well comprises applying the bias voltage having a higher voltage level than an operating voltage of the driving circuit.

* * * * *